(12) United States Patent
Adan

(10) Patent No.: US 6,627,505 B2
(45) Date of Patent: Sep. 30, 2003

(54) METHOD OF PRODUCING SOI MOSFET HAVING THRESHOLD VOLTAGE OF CENTRAL AND EDGE REGIONS IN OPPOSITE DIRECTIONS

(75) Inventor: Alberto Oscar Adan, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/061,356

(22) Filed: Feb. 4, 2002

(65) Prior Publication Data

US 2002/0177286 A1 Nov. 28, 2002

(30) Foreign Application Priority Data

Feb. 2, 2001 (JP) ........................................ 2001-027117

(51) Int. Cl.[7] ............................................. H01L 21/331
(52) U.S. Cl. ........................ 438/311; 438/282; 438/289; 438/291
(58) Field of Search ................................. 438/811, 282, 438/286, 289–291, 302, 306; 257/350

(56) References Cited

U.S. PATENT DOCUMENTS 5,841,170 A   11/1998   Adan et al.

FOREIGN PATENT DOCUMENTS

JP        06-268215   *   9/1994   ......... H01L/29/748

OTHER PUBLICATIONS

Antoniadis et al., "SOI Device and Circuit Technology", IEEE International SOI Conference Short Course, 1995, pp. 5–1 to 5–10.*

* cited by examiner

Primary Examiner—Carl Whitehead, Jr.
Assistant Examiner—Yennhu B Huynh
(74) Attorney, Agent, or Firm—Nixon & Vanderhye P.C.

(57) ABSTRACT

A method of producing a SOI MOSFET which includes a fully depleted channel region of a first conductivity type formed in a top semiconductor layer disposed on an insulative substrate, source/drain regions of a second conductivity type formed to sandwich the channel region and a gate electrode formed on the channel region with intervention of a gate insulating film, the method comprises: forming the channel region by setting an impurity concentration of channel edge regions of the channel region adjacent to the source/drain regions higher than an impurity concentration of a channel central region of the channel region, and setting a threshold voltage $Vth_0$ of the channel central region and a threshold voltage $Vth_{edge}$ of the channel edge regions so that a change of the threshold voltage $Vth_0$ with respect to a change of the thickness of the top semiconductor layer and a change of the threshold voltage $Vth_{edge}$ with respect to the change of the thickness of the top semiconductor layer are of opposite sign.

12 Claims, 9 Drawing Sheets

A: Rp · sin θ
B: Rp · cos θ

METHOD OF PRODUCING SOI MOSFET HAVING THRESHOLD VOLTAGE OF CENTRAL AND EDGE REGIONS IN OPPOSITE DIRECTIONS

CROSS-REFERENCE TO RELATED APPLICATION

This application is related to Japanese Patent Application No. 2001-27117 filed on Feb. 2, 2001, whose priority is claimed under 35 USC §119, the disclosure of which is incorporated by reference in its entirety.

BACKGROUND OF THE INVENTION

1. Field of the Invention

The present invention relates to a method of producing a SOI (silicon-on-insulator) MOSFET (metal oxide semiconductor field effect transistor), more particularly, to a method of producing a SOI MOSFET with reduced electrical characteristic fluctuations related to variations in the thickness of a top semiconductor layer (i.e., an active semiconductor layer) and a MOSFET.

2. Description of Related Art

Generally known MOSFETs formed on SOI substrates such as SOS (silicon on sapphire), SIMOX (silicon separation by ion implantation of oxygen) and BSOI (bonded SOI) substrates have advantages in low-voltage and high-speed operation. In addition to that, the SOI MOSFETs have an advantage over devices formed on bulk silicon substrates in that layout area for the SOI MOSFETs is smaller.

However, the SOI MOSFETs have only three terminals (gate, drain and source) while bulk silicon MOSFETs have four terminals (gate, drain, source and substrate). For this reason, the SOI MOSFETs are inferior in electrical characteristics, especially, short channel effect, drain/source blocking voltage, punch through and the like.

Referring to FIGS. 10(a) and 10(b), in a bulk silicon MOSFET, the base terminal of a parasite bipolar (NPN) transistor is tied to the substrate and the substrate-source junction is reversely biased. As a result, if an impact ion current Ii is generated near a drain region, the parasite bipolar transistor has very little effect on operation of the MOSFET.

In contrast, referring to FIGS. 9(a) and 9(b), in a SOI MOSFET, the base terminal of a parasite bipolar transistor is a top semiconductor layer in a floating state. As a result, in usual operation, an impact ion current Ii generated near a drain region acts as a base current of the parasite bipolar transistor to generate a positive feed-back effect, which results in reduction in the short-channel effect and decrease in the drain/source blocking voltage. In the case where a channel region is formed in a relatively thick top semiconductor layer, the channel region behaves in a partially depleted mode and a so-called kink effect is produced in output characteristics owing to impact-ionization. Therefore, the electrical characteristics of the SOI MOSFET are significantly affected.

Here, the kink is a phenomenon in which majority carriers generated by impact ionization accumulate to raise the potential of the floating substrate, bring down threshold voltage and further cause drain current to increase abruptly. Thus the operation of the SOI MOSFET is greatly affected.

In order to realize a fully depleted SOI free of the kink effect, there is a technique of forming a top silicon layer which is thinner than a depletion layer induced by the gate electrode. Generally, as shown in FIG. 11, the full depletion of the top silicon layer requires adjustment of the thickness of the top silicon layer and the impurity concentration Na in the substrate.

However, as understood from FIG. 11, a major drawback of the fully depleted SOI transistor is that the threshold voltage Vth is sensitive to the thickness of the top silicon layer.

That is, the threshold is represented by $$Vth \cong V_{fbt} + \frac{q \cdot Na \cdot Tsi}{C_{tox}} + 2 \cdot \qquad (1)$$

$$\Phi_F - \frac{C_{box}}{C_{tox}}(V_{sub} - V_{fbb})$$

$$\frac{\Delta Vth}{\Delta Tsi} \cong \frac{q \cdot Na}{C_{tox}}.$$

wherein $V_{fbt}$ is flat band voltage (at the top of the top silicon layer), $V_{fbb}$ is flat band voltage (at the bottom of the top silicon layer), $C_{tox}$ is capacity of a gate insulating film, Na is impurity concentration in the substrate, $T_{si}$ is thickness of the top silicon layer, $\phi F$ is Fermi potential and $V_{sub}$ is substrate voltage. For typical values of Na and the thickness of the gate insulating film, $\Delta Vth/\Delta T_{si}$ is about 10 mV/nm.

The threshold voltage affects or is related to electrical parameters such as OFF-state current which exponentially depends on the threshold voltage, as shown in the following formula:

$$I_{doff} \cong Io \cdot W \cdot 10^{\left(-\frac{Vth}{S}\right)}$$

wherein W is channel width of the transistor and $I_0$ is a constant when the gate voltage is 0V ($I_0$=about $10^{-7}$ A/µm).

For example, with a fully depleted SOI transistor (slope S (S factor) in a sub-threshold region is about 65 mV/dec), the OFF current varies 10 times if the threshold voltage changes by 65 mV. Thus, to control the threshold voltage is important for the characteristics of the semiconductor device.

In 1995 IEEE International SOI Conference Short Course, there was proposed a method for suppressing variations in the threshold of the SOI MOSFET using a constant dose method. In the constant dose method, ion implantation is carried out on the top silicon layer of the SOI substrate under such conditions that the dose $D=Na \times T_{si}$ is constant. As a result, it is understood from Formula (1) that the change of the threshold voltage Vth with respect to the thickness $T_{si}$ of the top silicon layer is suppressed. This is also clear from the relationship of $T_{si}$ to Vth shown in FIG. 12.

To suppress the dependency of Vth on Tsi, there is proposed a method of combining a partially depleted SOI and a fully depleted SOI as shown in FIG. 13 (Japanese Unexamined Patent Publication HEI 6(1994)-268215). In this device, the impurity concentration is higher at a channel edge 11 than at channel center 12 in the top silicon layer, and thereby, the channel edge 11 is not fully depleted but the channel center 12 is fully depleted. As a result, the threshold voltage of the SOI transistor is determined by the impurity concentration at the channel edge, and this device operates as a partially depleted device.

U.S. Pat. No. 5,841,170 discloses a SOI MOSFET whose channel region has an impurity profile that is nonuniform in a source/drain direction. This device is designed to have impurity concentrations such that full depletion is realized both at the channel center and at the channel edge. Thus, this device operates in a fully depleted mode and prevents the kink effect.

However, although the dependency of Vth on the thickness of the top silicon layer can be reduced by the constant dose method, the short-channel effect and the punch through are not considered. Since the impurity implantation is uniformly performed over the channel, the short-channel effect is more easily induced to take place.

The structure of the device proposed by Japanese Unexamined Patent Publication No. HEI 6(1994)-268215 can reduce the short-channel effect, but since the device operates in a partially depleted mode, the device is more susceptible to the kink effect and floating substrate effect.

The device proposed by U.S. Pat. No. 5,841,170 does not give any consideration to fluctuations in electrical characteristics related to variations in the thickness of the top silicon layer.

SUMMARY OF THE INVENTION

The present invention provides a method of producing a SOI MOSFET which includes a fully depleted channel region of a first conductivity type formed in a top semiconductor layer disposed on an insulative substrate, source/drain regions of a second conductivity type formed to sandwich the channel region and a gate electrode formed on the channel region with intervention of a gate insulating film, the method comprising:

forming the channel region by setting an impurity concentration of channel edge regions of the channel region adjacent to the source/drain regions higher than an impurity concentration of a channel central region of the channel region, and setting a threshold voltage $Vth_0$ of the channel central region and a threshold voltage $Vth_{edge}$ of the channel edge regions so that a change of the threshold voltage $Vth_0$ with respect to a change of the thickness of the top semiconductor layer and a change of the threshold voltage $Vth_{edge}$ with respect to the change of the thickness of the top semiconductor layer are of opposite sign.

That is, in view of the above-described problems, an object of the present invention is to provide a method of producing a highly reliable SOI MOSFET by effectively reducing the short-channel effect, the punch through and the like and suppressing the influence of the thickness of the top semiconductor layer on the electrical characteristics of the SOI MOSFET, and such a highly reliable SOI MOSFET.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
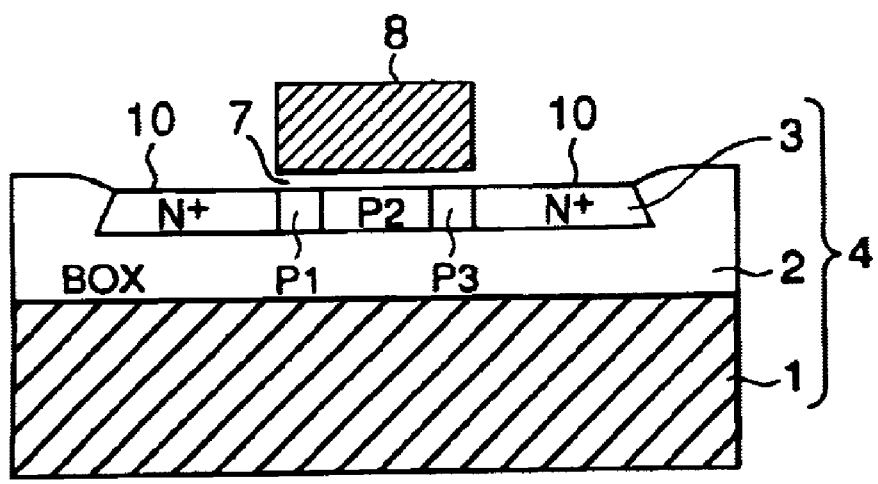
FIG. 1 is a schematic sectional view of a major part of a SOI MOSFET illustrating an embodiment in accordance with the present invention.

The SOI MOSFET of the present invention is formed on a substrate of SOI structure which is composed of an insulative substrate and a top semiconductor layer, and is mainly composed of a channel region of a first conductivity type, source/drain regions of a second conductivity type and a gate electrode formed on the channel region with intervention of a gate insulating film.

The insulative substrate of the SOI-structure substrate of the invention may be a substrate formed of an intrinsically insulative material such as sapphire, quartz, glass, plastic or the like, or a substrate in which a buried insulating film is formed on a support substrate. Here, examples of the support substrate include a substrate made of an element semiconductor such as silicon, germanium or the like and a substrate made of a compound semiconductor such as GaAs, InGaAs or the like. Among these substrates, a single crystal silicon substrate or a polysilicon substrate is preferred. Examples of the buried insulating film include a single-layer film or a multi-layer film of $SiO_2$, SiN and the like. The thickness of the insulative substrate may be set as appropriate depending upon the desired characteristics of the semiconductor device to be produced, the voltages to be applied when the produced semiconductor device is used, and others, but may be about 50 to 1,000 nm, preferably about 80 to 500 nm, for example.

The top semiconductor layer is typically a semiconductor thin film which functions as an active layer for forming a transistor and may be formed of a thin film of an element semiconductor such as silicon, germanium or the like or a compound semiconductor such as GaAs, InGaAs or the like. Among these, a silicon thin film is preferred. More preferably, the silicon thin film is formed of single crystal silicon. The thickness of the top semiconductor layer may be set as appropriate depending upon the structure of the semiconductor device to be produced, but may be about 10 to 1,000 nm, preferably about 10 to 500 nm, more preferably about 20 to 70 nm, for example.

The SOI-structure substrate may typically be composed of a support substrate having a buried insulating film and a top semiconductor layer which are formed on the support substrate. However, the SOI-structure substrate may be a multi-layer SOI substrate composed of a support substrate having a first buried insulating layer, a first top semiconductor layer, a second buried insulating layer, a second top semiconductor layer, . . . which are formed sequentially on the support substrate. Usable SOI-structure substrates include, for example, a SIMOX (separation by implantation of oxygen) type substrate wherein a semiconductor substrate is implanted with oxygen ions and thermally treated to form a buried oxide film as a first insulating layer in the semiconductor substrate; a BSOI (bonded SOI) substrate wherein two semiconductor substrates having oxide films formed thereon by thermal oxidation are bonded; a SOI substrate wherein a first insulating layer and a first semiconductor layer are formed on a semiconductor substrate by epitaxial growth; a so-called bonded multi-layer SOI substrate formed by bonding a SOI substrate wherein a first insulating layer and a first semiconductor layer are formed on a semiconductor substrate by epitaxial growth to a semiconductor substrate wherein an oxide film is formed on its surface by thermal oxidation or by epitaxial growth; and a multi-layer SOI substrate wherein a first insulating layer, a first semiconductor layer, a second insulating layer and a second semiconductor layer are formed on a semiconductor substrate by epitaxial growth. The SOI-structure substrate may be a substrate on which elements such as transistors, capacitors and the like or circuits are formed and device isolation regions may be optionally formed on the substrate by a LOCOS (local oxidation of silicon) separation method, a trench isolation method, an STI (shallow trench isolation) method or the like. One or more P-type or N-type wells may be formed on the SOI-structure substrate.

The MOSFET in the present invention may be of N-channel type or P-channel type or may be of both types.

The channel region of the first conductivity type of the MOSFET may be of P-type or N-type. The channel region has a channel central region and channel edge region. The channel edge region is located on edge of the channel regions, adjacently to the source/drain regions described later, and have a impurity concentration higher than the impurity concentration of the channel central region. In other words, the channel regions have a non-uniform impurity concentration profile in a source-to-drain direction. Difference between the impurity concentration Nb in the channel central region and the impurity concentration Na in the channel edge regions is not particularly limited so long as the impurity concentrations Na and Nb have a relationship described later, but may be Na/Nb=3 to 6 approximately.

In the channel central region, the threshold voltage $Vth_0$ of the channel central region is set at a desired value so that a change of the threshold voltage $Vth_0$ is a positive or a negative value with respect to a change of the thickness $T_{si}$ of the top semiconductor layer. In the channel edge regions, the threshold voltage $Vth_{edge}$ is set at a desired value so that a change of the threshold voltage $Vth_{edge}$ of the channel edge regions is a negative or a positive value with respect to the change of the thickness $T_{si}$ of the top semiconductor layer, that is, the change of the threshold voltage $Vth_{edge}$ of the channel edge regions is of sign opposite to the change of the threshold voltage $Vth_0$ of the channel central region. More particularly the change of the threshold voltage $Vth_0$ of the channel central region and the change of the threshold voltage $Vth_{edge}$ of the channel edge regions preferably meet $sign(\Delta Vth_0/\Delta T_{si})<0$ and $sign(\Delta Vth_{edge}/\Delta T_{si})>0$, respectively, or $sign(\Delta Vth_0/\Delta T_{si})>0$ and $sign(\Delta Vth_{edge}/\Delta T_{si})<0$, respectively.

In the SOI MOSFET having such a channel region, the threshold voltage Vth of the channel region as a whole is represented by the following formula:

$$Vth = Vth_0 + Vth_{edge}$$

(wherein $Vth_0$ is the threshold of the channel central region and $Vth_{edge}$ is the threshold of the channel edge region).

Accordingly, it is preferable that the above-mentioned relations are satisfied and the absolute value of $sign(\Delta Vth_0/\Delta T_{si})$ is almost equal to the absolute value of $sign(\Delta Vth_{edge}/\Delta T_{si})$. In other words, the change of the threshold voltage Vth of the entire channel region with respect to the change of the thickness $T_{si}$ of the top semiconductor layer preferably meets $(\Delta Vth/\Delta T_{si}) \approx 0$. That $(\Delta Vth/\Delta T_{si})$ is almost 0 means that the change of the threshold voltage Vth of the entire channel region is almost cancelled out with respect to the change of the thickness of the top semiconductor layer. The change of the threshold voltage Vth of the channel region as a whole is determined by the specification of the device and its production process. Generally, the change of the threshold voltage Vth is represented by the following formula with regard to mutually non-related parameters:

$$\Delta Vth \cong \sqrt{(\Delta Vth/\Delta Tsi)^2 \Delta Tsi^2 + (\Delta Vth/\Delta Tox)^2 \Delta Tox^2 + (\Delta Vth/\Delta L)^2 \Delta L^2}$$

In this case, major factors of variations of the change are $T_{si}$, L and $T_{ox}$. For example, regarding a typical transistor with L=0.25 $\mu$m, $T_{ox}$=5 nm and $T_{si}$=50 nm, there are obtained $\Delta L=\pm 0.7$ $\mu$m, $\Delta T_{ox}=\pm 0.5$ $\mu$m, $\Delta Tsi/Tsi<10\%$ and consequently $(\Delta Vth/\Delta Tsi)<1$ mV/nm, which is extremely small.

The channel central region has a lateral length of suitably about half, preferably about two-fifths, more preferably one-third of the minimum gate length of the SOI MOSFET. Specifically, about 0.01 $\mu$m to 0.4, $\mu$m and preferably about 0.03 $\mu$m to 0.13 $\mu$m may be mentioned. Preferably, the channel central region has an almost uniform impurity concentration in a depth direction and in a horizontal direction.

The channel edge regions have a lateral length of suitably about half, preferably about two-fifths, more preferably one-third of the minimum gate length of the SOI MOSFET. Specifically, about 0.01 $\mu$m to 0.4 $\mu$m and preferably about 0.03 $\mu$m to 0.13 $\mu$m may be mentioned. Preferably, the channel edge regions have an almost uniform impurity concentration in the depth direction and in the horizontal direction. That is because, if the channel edge regions have uniform impurity concentration, the threshold voltage $Vth_{edge}$ changes linearly with respect to the thickness $T_{si}$ of the top silicon layer. The channel edge regions may have different impurity concentrations and different impurity concentration distributions, but preferably, have the same impurity concentration and impurity concentration distribution.

The source/drain regions of the second conductivity type of the MOSFET are of a conductivity type opposite to the conductivity type of the channel region, and suitably have an impurity concentration of about 1 to $10 \times 10^{20}$ ions/cm$^3$. The source/drain regions may be a LDD structure, a DDD structure or the like.

The gate insulating film of the MOSFET, as gate insulating films of usual MOS transistors, may be formed of a single-layer film or a multi-layer film of a silicon oxide film, a silicon nitride film, a highly dielectric film (for example, Ti$_2$O$_5$) and the like. The thickness thereof may be about 2 to 7 nm in terms of SiO$_2$.

The gate electrode of the MOSFET, as gate electrodes of usual MOS transistors, may be formed of polysilicon; a silicide of a high-melting metal such as W, Ta, Ti, Mo or the like; a polycide formed of the above-mentioned silicide and polysilicon; other metal or the like, in a thickness of about 150 nm to 300 nm. The size and the shape of the gate electrode are not particularly limited, and may be selected as appropriate for obtaining desired characteristics. Sidewall spacers may be formed on the sidewalls of the gate electrode.

In order to form the above-described SOI MOSFET, that is, in order to realize an optimal impurity concentration profile in the channel region, impurity ions may be implanted at an implantation energy such that the peak of concentration is positioned at Rp (average projected range) from the surface and Rp/T$_{si}$ is 0.5 or less, more preferably about 0.25.

The SOI semiconductor device of the present invention may be formed using a general MOS process or CMOS process technique or using such a technique as a base process which may be modified appropriately for producing the above-described SOI semiconductor device. In the method of producing a SOI MOSFET of the present invention, in addition to a step for forming the above-described impurity concentration profile, may be performed as appropriate in optional order the formation of wells in the semiconductor substrate or the semiconductor layer, the formation of well contacts, the impurity introduction into the top semiconductor layer, the formation of the source/drain regions, the formation of LDD regions and/or the like, the formation of sidewall spacers, the formation of interlayer insulating films, the formation of contact holes in the interlayer insulating films, the formation of wiring layers, thermal treatment and the like.

The SOI MOSFET device of the present invention is now explained in detail below.

Figure 2A:
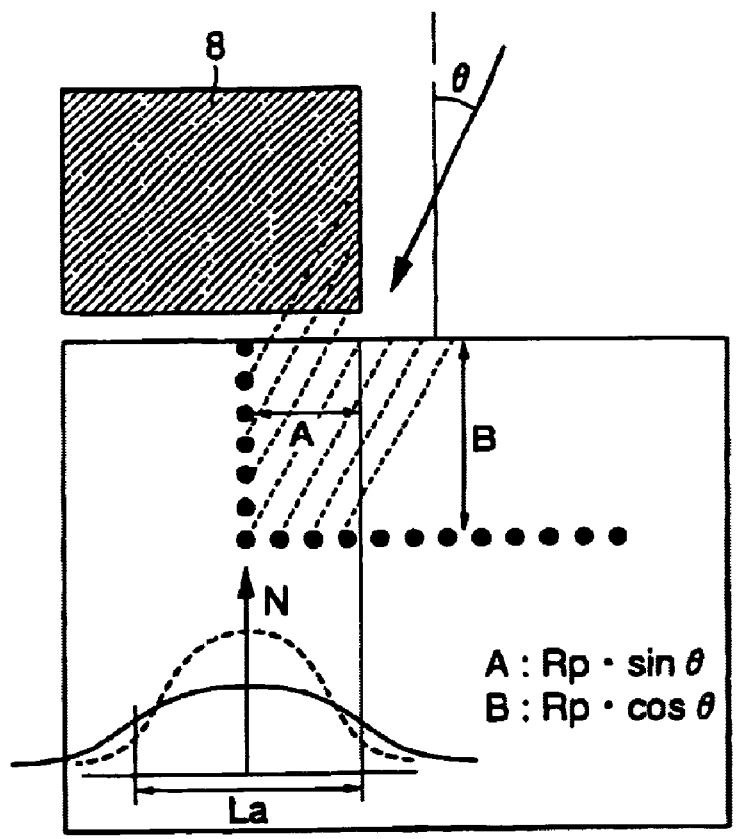
FIGS. 2(a) and 2(b) are schematic sectional views of a major part of a SOI MOSFET illustrating impurity concentration profile in the channel region of the SOI MOSFET in accordance with the present invention.
Figure 2B:
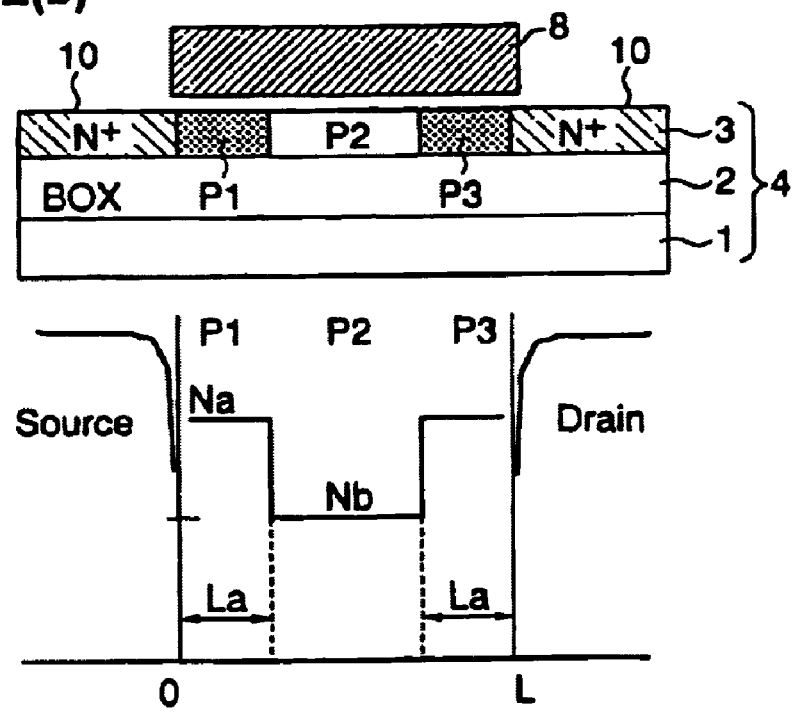

As shown in FIG. 1, FIG. 2(a) and FIG. 2(b), in the SOI MOSFET of the present invention, N-type source/drain regions 10 reaching a buried insulating film 2 are formed in a top silicon layer 3 of a SOI substrate 4 which is composed of a silicon substrate 1, the buried insulating film 2 and the top silicon layer 3. A gate electrode 8 is formed on the top silicon layer 3 between the source/drain regions 10 with intervention of a gate insulating film 7. Under the gate electrode 8, there is formed a channel region including a central region P2, and edge regions P1 and P3. The region P2 is adjusted to have an impurity concentration Nb (e.g., about 5×10$^{16}$ ions/cm$^3$), and the regions P1 and P3 are adjusted to have an impurity concentration Na (e.g., about 3×10$^{17}$ ions/cm$^3$) (see FIG. 2(b)).

Figure 3:
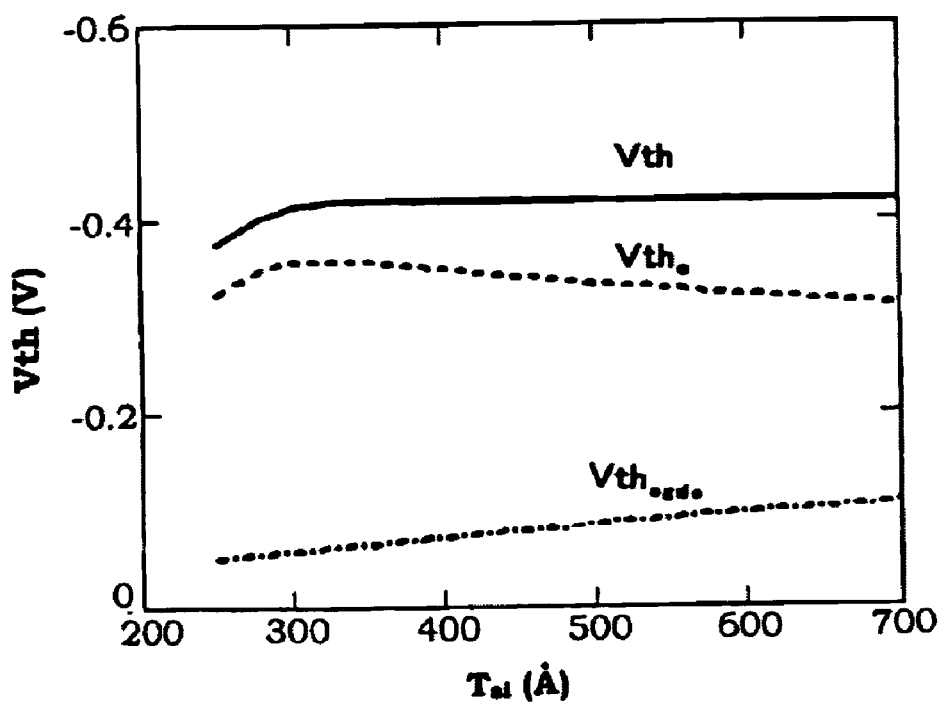
FIG. 3 is a graphical representation showing a relationship between the thickness $T_{si}$ of the top silicon layer and threshold voltage Vth.

In this SOI MOSFET, as shown in FIG. 3, the impurity concentration Nb of the region P2 contributes to Vth, and the profile thereof is such that Vth$_0$ decreases as the top silicon layer becomes thicker. On the other hand, the impurity concentration Na of the regions P1 and P3 also contributes to Vth, and the profile thereof is such that Vth$_{edge}$ increases as the top silicon layer becomes thicker. Thus, the total Vth of the SOI MOSFET is almost constant.

As described above, the SOI MOSFET of the present invention can suppress the dependency on the thickness of the top silicon layer. Also since the impurity concentrations are set as Na>Nb, the short-channel effect and the punch-through can be reduced.

The SOI MOSFET having these characteristics may be produced as follows.

As a SOI substrate 4, is used a silicon substrate 1 on which a buried oxide film 2 of about 120 nm thickness and a top silicon layer 3 of about 50 nm thickness are formed in this order. The active region of the MOSFT is defined by forming a device isolation film 5 by a LOCOS method. The top silicon layer 3 has a thickness which allows operation in fully depleted mode.

Figure 4A:
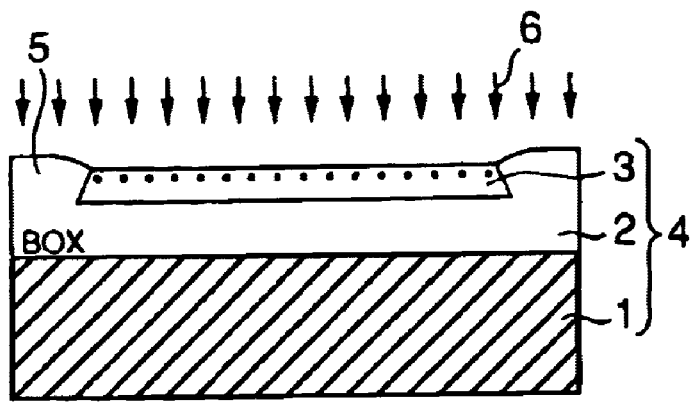
FIGS. 4(a) to 4(c) are schematic sectional views of a SOI MOSFET illustrating production steps for producing the SOI MOSFET in accordance with the present invention.
Figure 5:
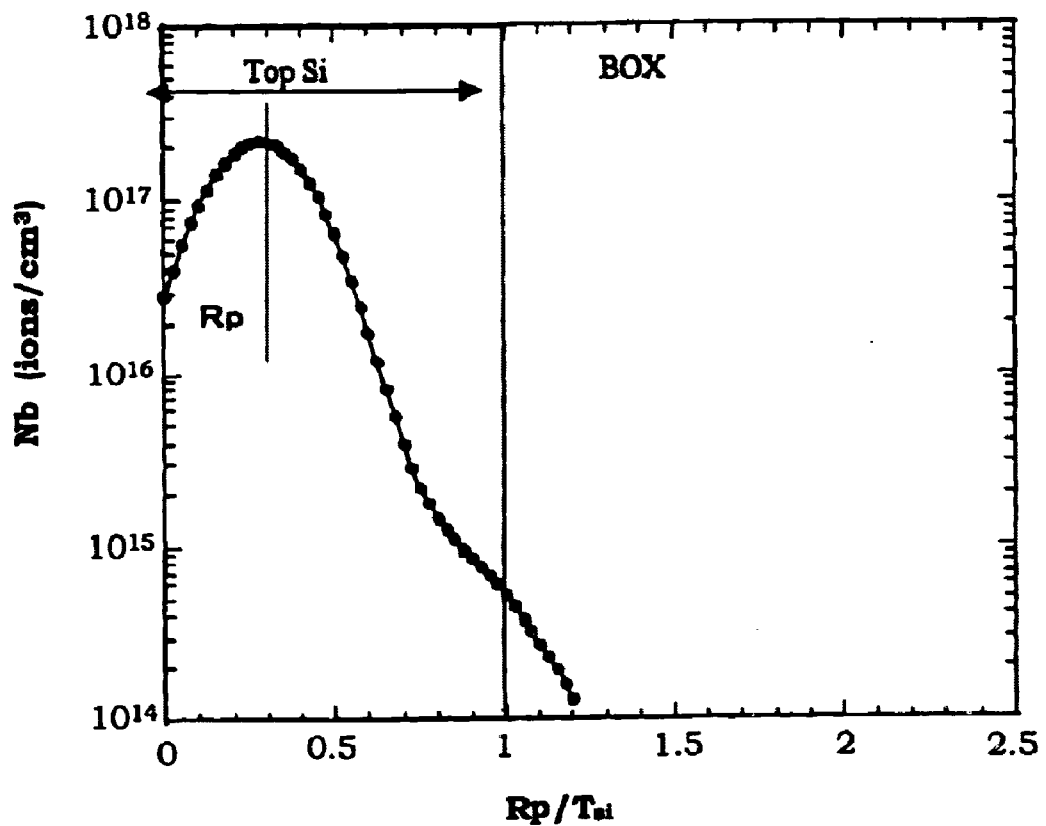
FIG. 5 is a graphical representation showing a relationship between the projected range of impurity ions/the thickness of the top silicon layer and the threshold voltage.

Next, as shown in FIG. 4(a), channel ion implantation (background implantation) is carried out on the active region of the MOSFET on the top silicon layer 3 (50 nm). In the case of a PMOSFET, the ion implantation is performed at an implantation energy of 10 keV at a dose of phosphorus ions 6 of about 1 to 4×10$^{12}$ ions/cm$^2$, for example. Thereby, a channel central region P2 can be formed which has an impurity concentration profile (at implantation) as shown in FIG. 5, and it is possible to obtain a substantially uniform final impurity concentration (about ~5×10$^{16}$ ions/cm$^3$) in the horizontal direction in the channel central region. The implantation energy satisfies Rp/T$_{si}$≈¼ since the projected range Rp is about 14 nm.

Figure 4B:
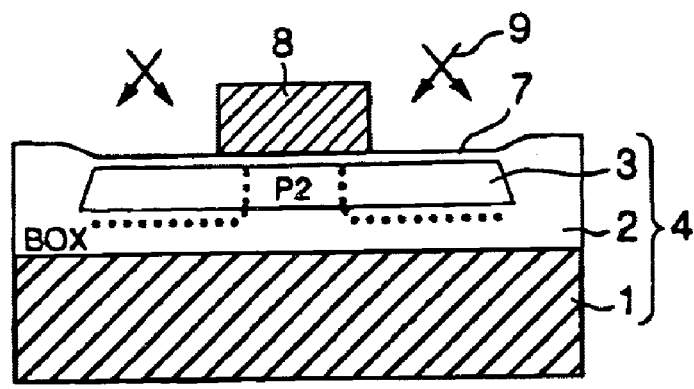

Next, as shown in FIG. 4(b), a gate insulating film 7 is formed on the entire surface of the tope silicon layer 3, and a gate electrode 8 with a channel length of about 0.18 µm is formed by a usual process. Thereafter, using the gate electrode 8 as a mask, tilt ion implantation is carried out on the channel edges. The tilt ion implantation is performed at a tilt angle θ of about 30°, an implantation energy of about 70 to 90 keV, a dose of phosphorus ions 9 of about 1 to 3×10$^{12}$ ions/cm$^2$ in two steps (by rotation).

Thereby, an impurity concentration profile as shown in FIGS. 2(a) and 2(b) is obtained at the channel edges. In the impurity concentration profile shown in FIG. 2(a), a dotted line represents the impurity concentration profile (about 5 to 6×10$^{17}$ ions/cm$^3$) at implantation, and a solid line represents the final implantation concentration profile (about 3×10$^{17}$ ions/cm$^3$). The channel edge regions are formed to have a length La=0.06 µm approximately. The length La is determined to satisfy conditions for full depletion in consideration of process margins.

Figure 4C:
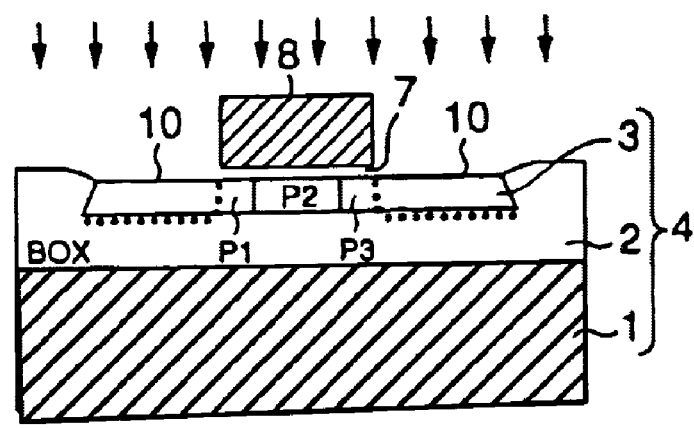

Thereafter, as shown in FIG. 4(c), BF$_2$ ions are implanted using the gate electrode 8 as a mask at an implantation energy of about 20 keV at a dose of about 4×10$^{15}$ ions/cm$^2$ to form source/drain regions 10.

Thus the SOI MOSFET shown in FIG. 1 is produced.

In the above-described example, the tilt ion implantation is similar to that disclosed in U.S. Pat. No. 5,841,170 for forming a non-uniform impurity channel. Accordingly, the final impurity concentration profile by the tilt ion implantation can reduce the short channel effect and the punch through as described in U.S. Pat. No. 5,841,170. Further, by optimizing both the cannel ion implantation and the ion implantation into the channel edges, it is possible to reduce fluctuations in the electrical characteristics of transistors due to variations in the thickness of the top silicon layer.

Figure 6:
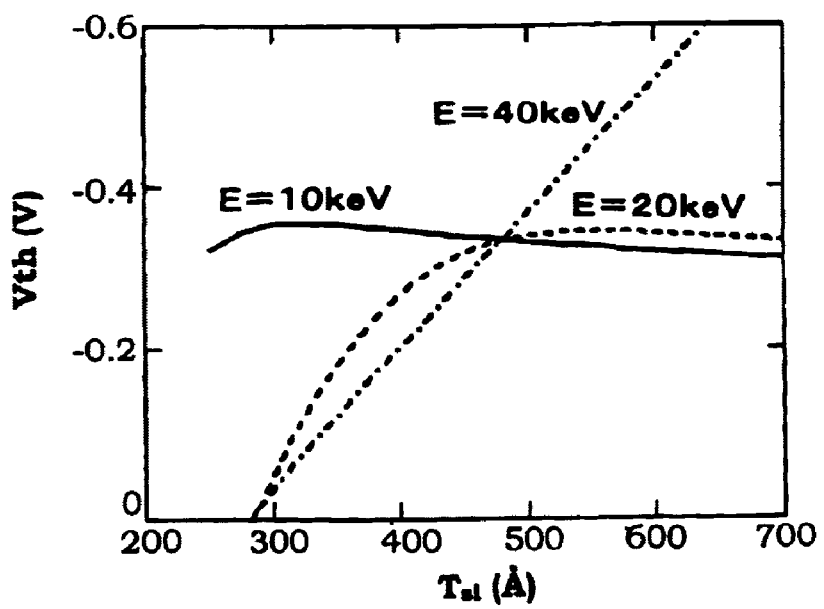
FIG. 6 is a graphical representation showing relationships between the thickness $T_{si}$ of the top silicon layer and threshold voltage Vth at varied ion implantation energies.
Figure 7:
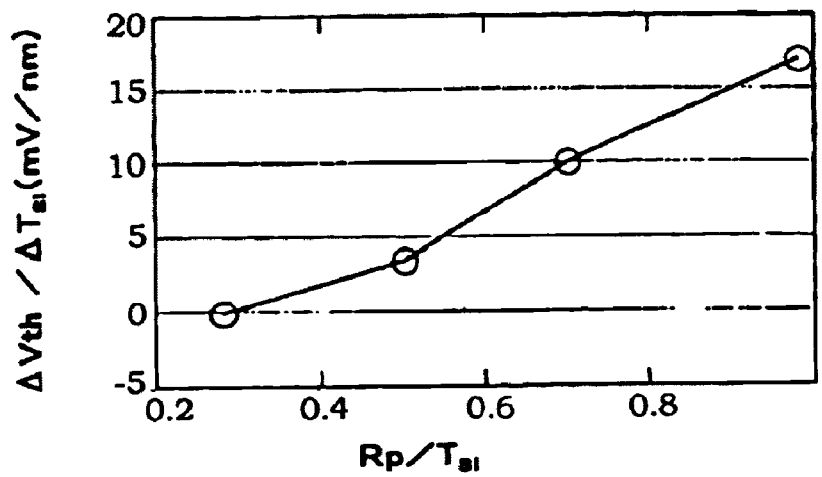
FIG. 7 is a graphical representation showing a relationship between the projected range of impurity ions/the thickness of the top silicon layer and the change of the threshold voltage/the change of the thickness of the top silicon layer.

With regard to the channel ion implantation, FIG. 6 shows relationships between the thickness T$_{si}$ of the top silicon layer and the total threshold voltage Vth in the cases where the ion implantation is performed by varying the thickness of the top silicon layer and the ion implantation energy. In FIG. 6, phosphorus ions are implanted at implantation energies of 10 keV (represented by a solid line), 20 keV (represented by a dotted line) and 40 keV (represented by an alternate long and short dash line). FIG. 7 shows a relationship between the change of the threshold voltage and the change of the thickness of the top silicon layer, i.e., ΔVth/ΔT$_{si}$ of the SOI MOSFET, as a function of the thickness of the top silicon layer. In FIG. 7, ions are implanted at implantation energies of 40 keV, 30 keV, 20 keV and 12 keV.

According to FIG. 6 and FIG. 7, if the implantation energy is 40 keV, since Rp is about 49 nm, the change of the threshold voltage to the thickness of the top silicon layer ($\Delta Vth/\Delta T_{si}$) is the largest, about 17 mV/nm. On the other hand, if the implantation energy is small (i.e., Rp is small), $\Delta Vth/\Delta T_{si}$ becomes almost 0. Especially, if Rp is one-fourth or less of the thickness of the top silicon layer, $\Delta Vth/\Delta T_{si}$ is negative.

Further, by varying the impurity ions implantation conditions for and the thickness of the top silicon layer, the change of the total threshold voltage Vth of the SOI MOSFET is observed with respect to the thickness of the top semiconductor layer. The results are shown in FIGS. 8(a) and 8(b).

Figure 8A:
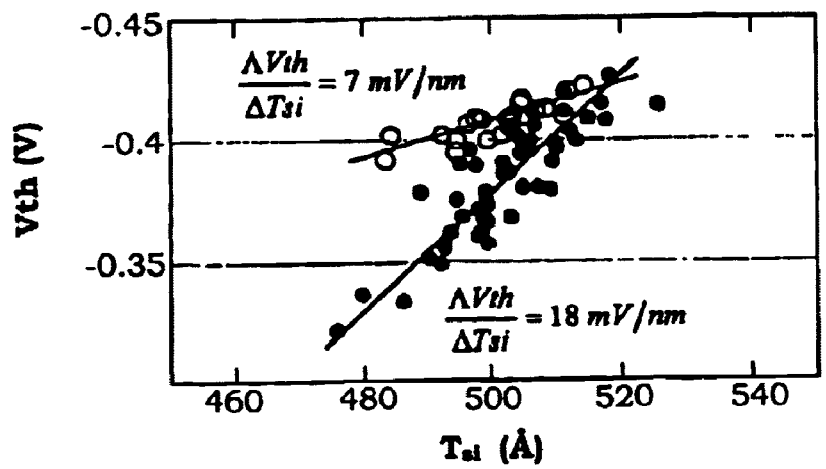
FIGS. 8(a) and 8(b) are graphical representations showing relationships between the thickness of the top silicon layer and the threshold voltage Vth.

According to FIG. 8(a), in the case where the SOI MOSFET is formed by a usual production method, $\Delta Vth/\Delta T_{si}$ is about 18 mV/nm, which is a large value, at E=40 keV (solid circles in FIG. 8(a)).

On the other hand, if $Rp/T_{si}$ is about 0.6, $\Delta Vth/\Delta T_{si}$ is improved to about 7 mV/nm at E=25 keV (hollow circles in FIG. 8(a)).

Figure 8B:
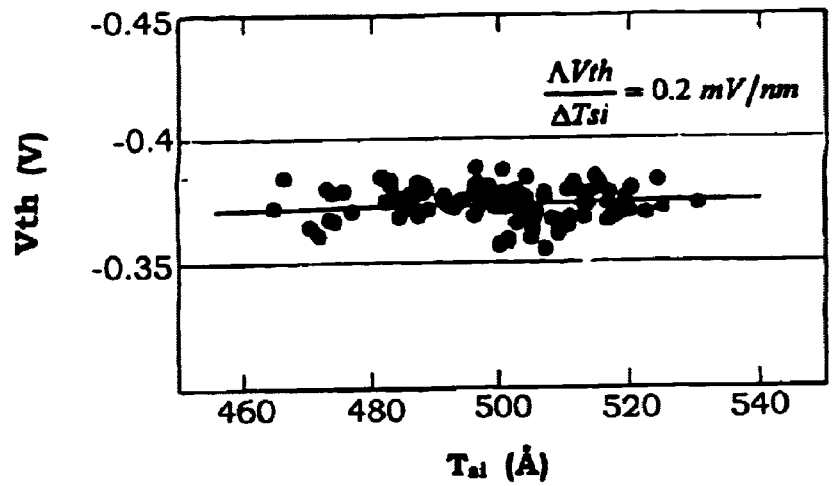
Figure 9A:
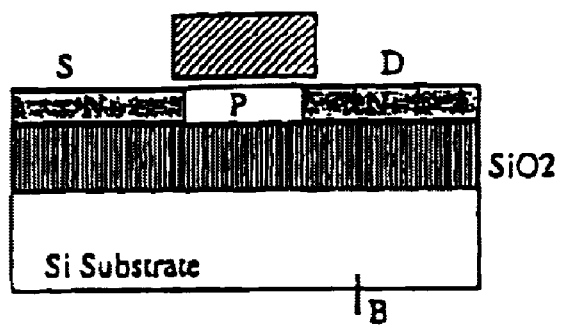
FIGS. 9(a) and 9(b) are a schematic sectional view of a prior-art SOI MOSFET and its equivalent circuit diagram.
Figure 9B:
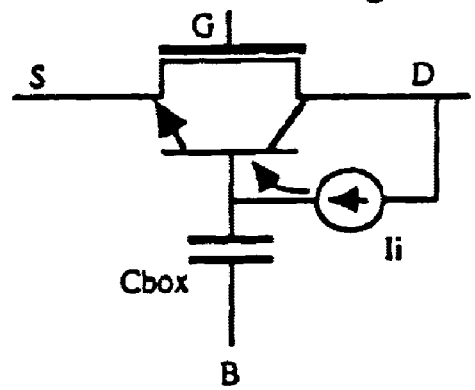
Figure 10A:
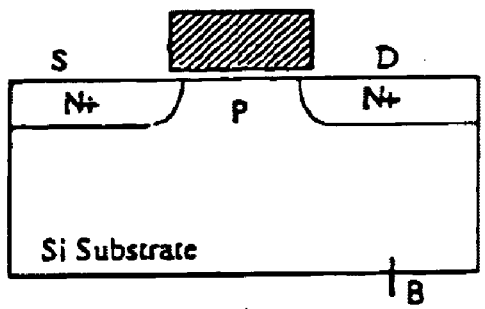
FIGS. 10(a) and 10(b) are a schematic sectional view of a prior-art MOSFET and its equivalent circuit diagram.
Figure 10B:
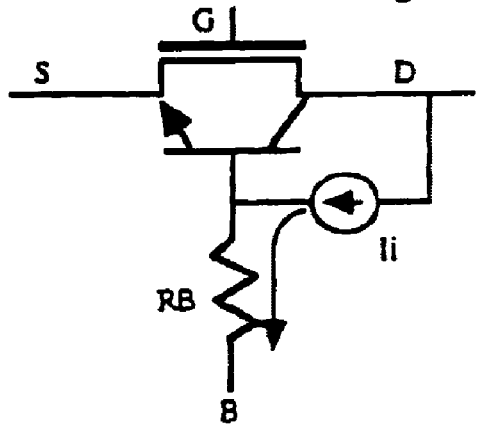
Figure 11:
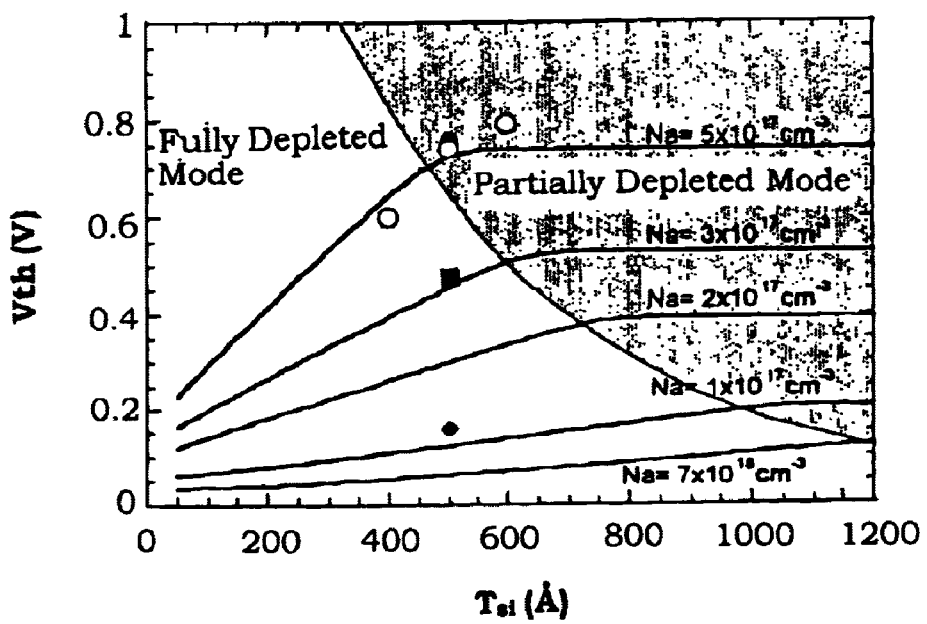
FIG. 11 is a graphical representation showing relationships between the thickness $T_{si}$ of the top silicon layer and the threshold voltage Vth.
Figure 12:
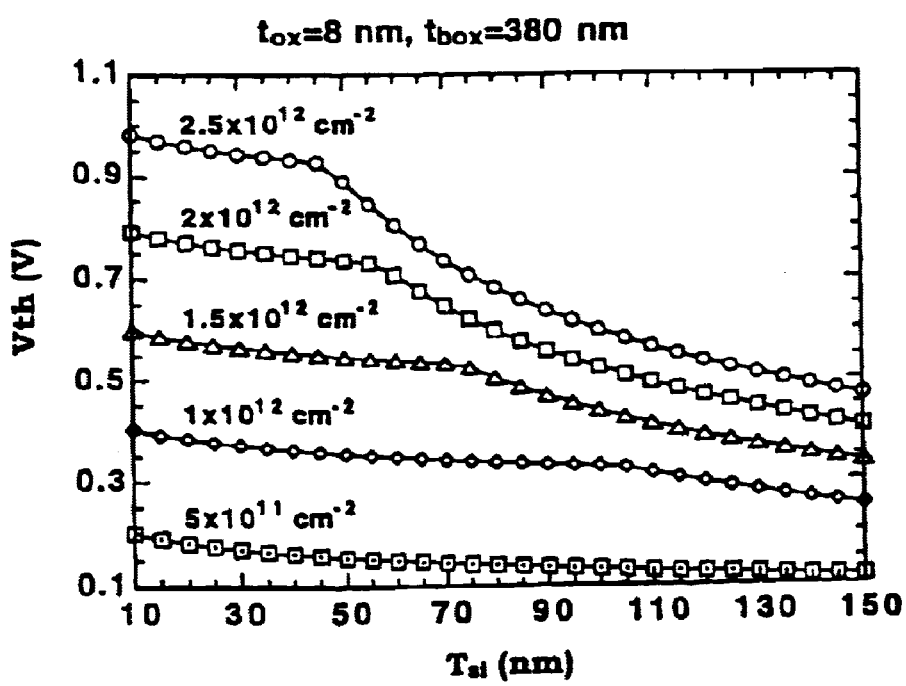
FIG. 12 is a graphical representation showing relationships between the thickness $T_{si}$ of the top silicon layer and the threshold voltage Vth in a MOSFET formed by a prior-art constant dose method.
Figure 13:
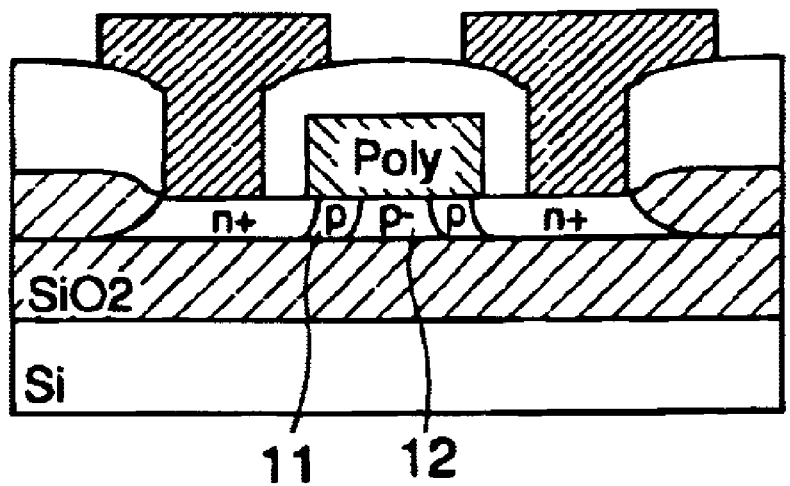
FIG. 13 is a schematic sectional view of another prior-art MOSFET.

As shown in FIG. 8(b), if $Rp \approx T_{si}/4$, $\Delta Vth/\Delta T_{si}$ is about 0.2 mV/nm at E=12 keV. The Vth fluctuations with respect to variations in the thickness of the top semiconductor layer can be suppressed.

According to the present invention, the threshold voltage $Vth_0$ of the channel central region and the threshold voltage $Vth_{edge}$ of the channel edge regions are so set that the change of $Vth_0$ with respect to the change of the thickness of the top semiconductor layer and the change of the $Vth_{edge}$ to the change of the thickness of the top semiconductor layer are of opposite sign. Accordingly, the short-channel effect and the punch through can be effectively reduced, while the influence of the thickness of the top semiconductor layer on the electrical characteristics can be reduced, which leads to the production of highly reliable SOI MOSFETs.

Especially, the change of the threshold voltage owing to variations in the thickness of the top semiconductor layer can be effectively suppressed in the case where the changes of the threshold voltages of the channel central region and the channel edge regions with respect to the change of the thickness $T_{si}$ of the top semiconductor layer meet sign($\Delta Vth_0/\Delta T_{si}$)<0 and sign($\Delta Vth_{edge}/\Delta T_{si}$)>0, or sign($\Delta Vth_0/\Delta T_{si}$)>0 and sign($\Delta Vth_{edge}/\Delta T_{si}$)<0 and the change of the threshold voltage Vth of the entire channel region with respect to the change of the thickness $T_{si}$ of the top semiconductor layer meets $\Delta Vth/\Delta T_{si} \approx 0$; or in the case where the channel central region is formed to have a peak concentration at the projected range Rp, which has a depth of half or less of the thickness $T_{si}$ of the top semiconductor layer, by implanting ions of a first conductivity type and the channel edge regions have a constant impurity concentration in the depth direction of the top semiconductor layer and has a lateral length of one-third or less of the minimum channel length; or in the case where the channel central region has a constant impurity concentration in the depth direction of the top semiconductor layer, the channel edge regions are formed to have a peak concentration at a projected range Rp which has a depth of half or less of the thickness $T_{si}$ of the top semiconductor layer, by implanting ions of a first conductivity type and the channel edge regions has a lateral length of one-third or less of the minimum channel length.

Since the method of the present invention is so compatible with usual production methods for semiconductors that fluctuations of the threshold voltage can be suppressed and production margins and yield can be improved without adding complicated production steps. Further, the decrease of the fluctuations of the electrical characteristics increases the operational margins of devices and simplifies the design of the devices. Consequently, the production process can be simplified and the production costs are reduced.

What is claimed is:

1. A method of producing a SOI MOSFET which includes a fully depleted channel region of a first conductivity type formed in a top semiconductor layer disposed on an insulative substrate, source/drain regions of a second conductivity type formed to sandwich the channel region and a gate electrode formed on the channel region with intervention of a gate insulating film, the method comprising:

forming the channel region by setting an impurity concentration of channel edge regions of the channel region adjacent to the source/drain regions higher than an impurity concentration of a channel central region of the channel region, and setting a threshold voltage $Vth_0$ of the channel central region and a threshold voltage $Vth_{edge}$ of the channel edge regions so that a change of the threshold voltage $Vth_0$ with respect to a change of the thickness of the top semiconductor layer and a change of the threshold voltage $Vth_{edge}$ with respect to the change of the thickness of the top semiconductor layer are of opposite sign.

2. The method of claim 1, wherein the changes of the threshold voltages of the channel central region and the channel edge regions with respect to the change of the thickness Tsi of the top semiconductor layer meet sign($\Delta Vth_0/\Delta T_{si}$)<0 and sign($\Delta Vth_{edge}/\Delta T_{si}$)>0, and a change of a threshold voltage Vth of the channel region as a whole meets ($\Delta Vth/\Delta T_{si}$)≈0.

3. The method of claim 2, wherein the formation of the channel region comprises forming, by implanting ions of the first conductivity type, the channel central region which has a peak concentration at a depth of half or less of the thickness $T_{si}$ of the top semiconductor layer and forming the channel edge regions which have a constant impurity concentration in a depth direction of the top semiconductor layer and have a lateral length of one-third or less of the length of the channel region.

4. The method of claim 1, wherein the changes of the threshold voltages of the channel central region and the channel edge regions with respect to the change of the thickness Tsi of the top semiconductor layer meet sign($\Delta Vth_0/\Delta T_{si}$)>0 and sign($\Delta Vth_{edge}/\Delta T_{si}$)<0 and a change of a threshold voltage Vth of the channel region as a whole meets ($\Delta Vth/\Delta T_{si}$)≈0.

5. The method of claim 4, wherein the formation of the channel region comprises forming, by implanting ions of the first conductivity type, the channel central region which has a constant impurity concentration in a depth direction of the top semiconductor layer and forming, by implanting ions of the first conductivity type, the channel edge regions which have a peak concentration at a depth of half or less of the thickness $T_{si}$ of the top semiconductor layer and have a lateral length of one-third or less of the length of the channel region.

6. The method of claim 1, wherein the formation of the channel region comprises forming, by implanting ions of the first conductivity type, so that the impurity concentration Nb in the channel central region and the impurity concentration Na in the channel edge regions meets Na/Nb=3 to 6.

7. A method of producing a SOI MOSFET which includes a fully depleted channel region of a first conductivity type formed in a top semiconductor layer disposed on a substrate, source/drain regions of a second conductivity type formed to sandwich the channel region, and a gate electrode formed over the channel region with intervention of a gate insulating film, the method comprising:

forming the channel region by setting an impurity concentration of at least one channel edge region higher than an impurity concentration of a channel central region of the channel region, and setting a threshold voltage $Vth_0$ of the channel central region and a threshold voltage $Vth_{edge}$ of the channel edge region so that a change of the threshold voltage $Vth_0$ with respect to a change of the thickness of the top semiconductor layer and a change of the threshold voltage $Vth_{edge}$ with respect to the change of the thickness of the top semiconductor layer are of opposite sign.

8. The method of claim 7, wherein the top semiconductor layer comprises silicon, and wherein changes of the threshold voltages of the channel central region and the channel edge region with respect to the change of the thickness Tsi of the top semiconductor layer meet $$\text{sign}(\Delta Vth_0/\Delta T_{si})>0 \text{ and } \text{sign}(\Delta Vth_{edge}/\Delta T_{si})>0,$$

and a change of a threshold voltage Vth of the channel region as a whole meets $$(\Delta Vth/\Delta T_{si})=0.$$

9. The method of claim 8, wherein the formation of the channel region comprises forming, by implanting ions of the first conductivity type, the channel central region which has a peak concentration at a depth of half or less of the thickness $T_{si}$ of the top semiconductor layer and forming at least one channel edge region which has a constant impurity concentration in a depth direction of the top semiconductor layer and a lateral length of one-third or less of the length of the channel region.

10. The method of claim 7, wherein the top semiconductor layer comprises Si, and wherein changes of the threshold voltages of the channel central region and the channel edge region with respect to the change of the thickness Tsi of the top semiconcductor layer meet $$\text{sign}(\Delta Vth_0/\Delta T_{si})>0 \text{ and } \text{sign}(\Delta Vth_{edge}/\Delta T_{si})>0$$

and a change of a threshold voltage Vth of the channel region as a whole meets $$(\Delta Vth/\Delta T_{si})=0.$$

11. The method of claim 10, wherein the formation of the channel region comprises forming, by implanting ions of the first conductivity type, the channel central region which has a constant impurity concentration in a depth direction of the top semiconductor layer and forming, by implanting ions of the first conductivity type, first and second channel edge regions which have a peak concentration at a depth of half or less of the thickness $T_{si}$ of the top semiconductor layer and have a lateral length of one-third or less of the length of the channel region.

12. The method of claim 7, wherein the formation of the channel region comprises forming, by implanting ions of the first conductivity type, so that the impurity concentration Nb in the channel central region and the impurity concentration Na in the channel edge region meets Na/Nb=3 to 6.

* * * * *